(12) United States Patent
Na et al.

(10) Patent No.: US 11,328,969 B2
(45) Date of Patent: May 10, 2022

(54) SEMICONDUCTOR DEVICE AND MANUFACTURING METHOD THEREOF

(71) Applicant: Amkor Technology Singapore Holding Pte. Ltd., Singapore (SG)

(72) Inventors: Do Hyun Na, Seoul (KR); Sung Soon Park, Seoul (KR); Dae Gon Kim, Gyeonggi-do (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 317 days.

(21) Appl. No.: 15/815,243

(22) Filed: Nov. 16, 2017

(65) Prior Publication Data

US 2019/0148254 A1    May 16, 2019

(51) Int. Cl.

| H01L 23/31 | (2006.01) |
|---|---|
| H01L 23/48 | (2006.01) |
| H01L 23/00 | (2006.01) |
| H01L 23/522 | (2006.01) |
| H01L 23/538 | (2006.01) |

(52) U.S. Cl.
CPC ........ *H01L 23/3114* (2013.01); *H01L 23/481* (2013.01); *H01L 23/5226* (2013.01); *H01L 23/5389* (2013.01); *H01L 24/19* (2013.01); *H01L 24/20* (2013.01); *H01L 24/26* (2013.01); H01L 23/3128 (2013.01); H01L 2224/13026 (2013.01); H01L 2224/18 (2013.01); H01L 2224/96 (2013.01); H01L 2924/182 (2013.01)

(58) Field of Classification Search
CPC .............. H01L 23/3114; H01L 23/481; H01L 23/5226; H01L 24/26; H01L 2224/13026; H01L 2924/182
See application file for complete search history.

(56) References Cited

U.S. PATENT DOCUMENTS

| 9,524,959 B1* | 12/2016 | Yeh ...................... H01L 23/5226 |
| 2006/0118939 A1* | 6/2006 | Fisher ................... H01L 23/481 |
| | | 257/690 |
| 2009/0039523 A1* | 2/2009 | Jiang ....................... H01L 24/97 |
| | | 257/777 |

(Continued)

FOREIGN PATENT DOCUMENTS

KR    20110115812    10/2011

OTHER PUBLICATIONS

Taiwanese Office Action for Application No. 107104741, dated Jul. 29, 2021, 18 pages.

*Primary Examiner* — Peter Bradford
(74) *Attorney, Agent, or Firm* — McAndrews, Held & Malloy, Ltd.

(57) ABSTRACT

A semiconductor device includes a first semiconductor die, a first encapsulant surrounding the first semiconductor die, and a first redistribution structure formed on the first semiconductor die and the first encapsulant. The semiconductor device further includes a second semiconductor die, a second encapsulant surrounding the second semiconductor die, and a second redistribution structure formed on the second semiconductor die and the second encapsulant. The semiconductor device also include a conductive via electrically connecting the first redistribution structure to the second redistribution structure.

12 Claims, 12 Drawing Sheets

(56) References Cited

U.S. PATENT DOCUMENTS

| | | | |
|---|---|---|---|
| 2009/0239336 A1* | 9/2009 | Lee | H01L 24/96 |
| | | | 438/107 |
| 2009/0267194 A1* | 10/2009 | Chen | H01L 25/0657 |
| | | | 257/621 |
| 2010/0130003 A1* | 5/2010 | Lin | H01L 25/0657 |
| | | | 438/637 |
| 2010/0327439 A1 | 12/2010 | Hwang et al. | |
| 2011/0068427 A1 | 3/2011 | Paek et al. | |
| 2011/0175218 A1 | 7/2011 | Liou et al. | |
| 2011/0176280 A1 | 7/2011 | Lee | |
| 2012/0020026 A1* | 1/2012 | Oganesian | H01L 21/76877 |
| | | | 361/707 |
| 2012/0049364 A1 | 3/2012 | Sutardja et al. | |
| 2013/0037950 A1* | 2/2013 | Yu | H01L 23/5389 |
| | | | 257/738 |
| 2015/0108661 A1* | 4/2015 | Vincent | H01L 23/5383 |
| 2016/0260695 A1* | 9/2016 | Chung | H01L 25/18 |
| 2017/0053898 A1 | 2/2017 | Yeh et al. | |
| 2017/0092510 A1 | 3/2017 | Oh et al. | |
| 2017/0092622 A1* | 3/2017 | Wu | H01L 24/82 |
| 2017/0194290 A1* | 7/2017 | Yu | H01L 25/0652 |
| 2020/0066663 A1* | 2/2020 | Aleksov | H01L 23/3121 |

\* cited by examiner

SEMICONDUCTOR DEVICE AND MANUFACTURING METHOD THEREOF

FIELD OF THE DISCLOSURE

Various aspects of the present disclosure relate to a semiconductor device and a manufacturing method thereof.

BACKGROUND

Semiconductor packaging protects integrated circuits, or chips, from physical damage and external stresses. In addition, the semiconductor packaging can provide a thermal conductance path to efficiently remove heat generated in a chip, and also provide electrical connections to other components such as printed circuit boards, for example. Materials used for semiconductor packaging typically comprises ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with some aspects of the present disclosure as set forth in the remainder of the present application with reference to the drawings.

BRIEF DESCRIPTION OF THE DRAWINGS

Common reference numerals are used throughout the drawings and the detailed description to indicate the same and/or similar elements.

DETAILED DESCRIPTION

Figure 1:
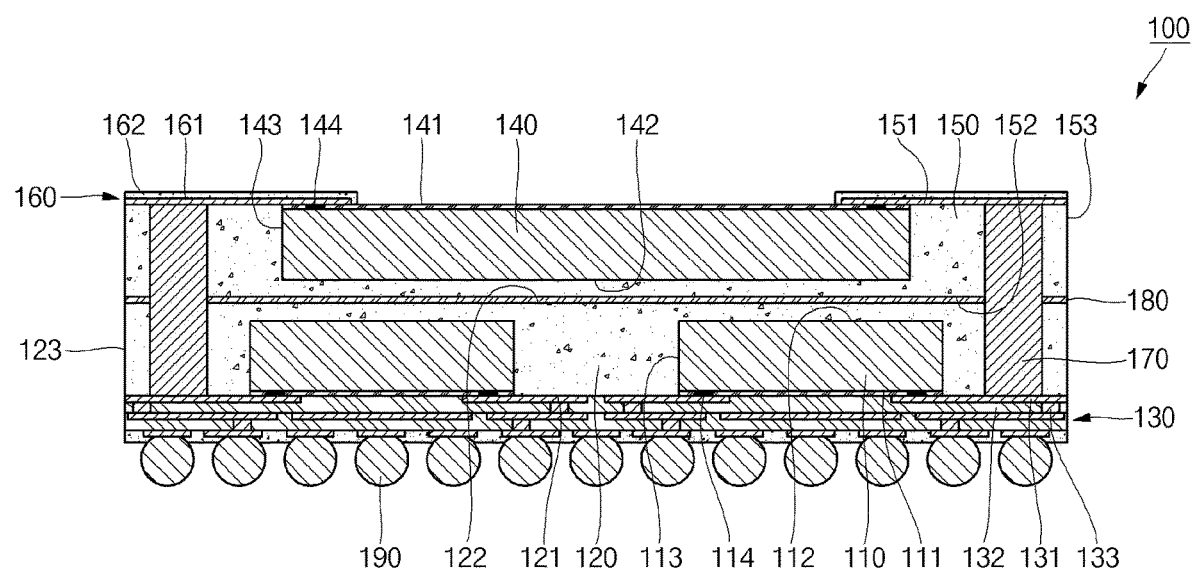
FIG. 1 is a cross-sectional view of a semiconductor device according to an example embodiment of the present disclosure.

Various aspects of the present disclosure can be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

In the drawings, the thickness of layers and regions are exaggerated for clarity. Here, like reference numerals refer to like elements throughout. As used herein, the term "and/or" includes any and all combinations of one or more of the associated listed items. It will also be understood that when an element A is referred to as being "connected to" an element B, the element A can be directly connected to the element B or an intervening element C can be present and the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise, include" and/or "comprising, including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein can be interpreted accordingly.

Furthermore, the term "coplanar" and similar terms are used herein to denote two surfaces that lie within the same plane. Coplanar surfaces can be adjacent or adjoining each other; however non-adjacent and/or non-adjoining surfaces can also be coplanar. For example, a gap, a void, and/or other structures may be interposed between the coplanar surfaces. Furthermore, due to manufacturing tolerances, thermal expansion, and the like, slight deviations can exist in coplanar surfaces. Such deviations can result in one surface being slightly higher than the other surface, thus forming a step-off (e.g., a step-up or step-down) between surfaces. As used herein, the term "coplanar" includes surfaces having a step-off ranging between 0 and 7 microns.

Various embodiments of the present disclosure provide a semiconductor device and a manufacturing method thereof, which can implement a three-dimensional (3D) system in package including a sensor by a wafer level process.

Various embodiments of the present disclosure also provide a semiconductor device and a manufacturing method thereof, which can implement a very thin three-dimensional (3D) package including a sensor.

Various embodiments of the present disclosure also provide a semiconductor device and a manufacturing method thereof, which can be employed to a fingerprint sensor, an optical sensor or a tire pressure sensor.

According to various embodiments of the present disclosure, the semiconductor device can include a first semiconductor die including a first surface, a second surface opposite to the first surface and a first die-bond pad formed on the first surface, a first encapsulant surrounding the first semiconductor die and including a first surface adjacent the first surface, a first redistribution structure formed on the first surface of the first semiconductor die and the first surface of the first encapsulant, a second semiconductor die including a first surface, a second surface opposite to the first surface and a second die-bond pad formed on the first surface, a second encapsulant surrounding the second semiconductor die and including a first surface adjacent the first surface, a second redistribution structure formed on the first surface of the second semiconductor die and the first surface of the second encapsulant, and a conductive via extending through the first encapsulant and the second encapsulant to electrically connect the first redistribution structure and the second redistribution structure to each other.

In addition, according to various embodiments of the present disclosure, the semiconductor device can include a first semiconductor die including a first die-bond pad, a first encapsulant exposing the first die-bond pad while surrounding the first semiconductor die, a first redistribution structure formed on the first semiconductor die and the first encapsulant while being connected to the first die-bond pad, a second semiconductor die including a second die-bond pad, a second encapsulant exposing the second die-bond pad while surrounding the second semiconductor die, a second redistribution structure formed on the second semiconductor die and the second encapsulant while being connected to the second die-bond pad, and a conductive via electrically connecting the first redistribution structure and the second redistribution structure to each other.

Further, according to various embodiments of the present disclosure, the semiconductor device can include a first semiconductor die, a first encapsulant surrounding the first semiconductor die, a first redistribution structure formed on the first semiconductor die and the first encapsulant, a second semiconductor die, a second encapsulant surrounding the second semiconductor die, a second redistribution structure formed on the second semiconductor die and the second encapsulant, and a conductive via electrically connecting the first redistribution structure and the second redistribution structure to each other.

As described above, according to various embodiments of the present disclosure, it is possible to provide a semiconductor device and a manufacturing method thereof, which can implement a three-dimensional (3D) system in package including a sensor by a wafer level process. That is to say, according to various embodiments of the present disclosure, a first encapsulant is formed while a first semiconductor die (for example, a logic die, etc.) determined as a good product is mounted on a first carrier, and a second encapsulant is formed while a second semiconductor die (for example, a sensor die, etc.) determined as a good product is mounted on a second carrier. Then, in a state in which the first and second encapsulants are adhered to each other, a conductive via and a redistribution structure are formed. Finally, individual devices are formed by a sawing process, thereby implementing a 3D system in package including a sensor using a wafer level process.

In addition, according to various embodiments of the present disclosure, it is possible to provide a semiconductor device and a manufacturing method thereof, which can implement a very thin three-dimensional (3D) package including a sensor. That is to say, a first semiconductor die (for example, a logic die, etc.) and a second semiconductor die (for example, a sensor die, etc.) are made to come close to each other to then be stacked vertically and thin redistribution structures, instead of a relatively thick circuit board, are formed on surfaces of the first and second semiconductor dies by a fan-out method, thereby implementing a very thin three-dimensional (3D) package including a sensor. While various embodiments utilize the thin redistribution structures provided by a fan-out method, other embodiments may instead utilize pre-fabricated circuit boards.

Further, according to various embodiments of the present disclosure, it is possible to provide a semiconductor device and a manufacturing method thereof, which can be employed to a fingerprint sensor, an optical sensor or a tire pressure sensor. In particular, according to various embodiments of the present disclosure, various kinds of sensors and processors are integrated into a single package, thereby reducing the overall system size and minimizing the power consumption.

Referring to FIG. 1, a cross-sectional view of a semiconductor device 100 according to an example embodiment of the present disclosure is illustrated. As illustrated in FIG. 1, the semiconductor device 100 can include one or more first semiconductor dies 110, a first encapsulant 120, a first redistribution structure 130, a second semiconductor die 140, a second encapsulant 150, a second redistribution structure 160, and a conductive via 170. In addition, the semiconductor device 100 can further include an adhesion layer 180 adhering the first encapsulant 120 and the second encapsulant 150 to each other. The semiconductor device 100 can further include a plurality of external interconnection structures 190 connected to the first redistribution structure 130 or the second redistribution structure 160.

Each of the one or more first semiconductor dies 110 can have a substantially planar first surface 111, and a substantially planar second surface 112 opposite to the first surface 111. Each first semiconductor die 10 can further have a substantially planar third surface 113 connecting the first surface 111 and the second surface 112 to each other, and at least one bond pad 114 formed on the first surface 111.

The first surface 111 can further include a passivation layer. In particular, the first surface 111 can correspond to a surface of the passivation layer. In addition, the first surface 111 can correspond to an active region and the second surface 112 can correspond to an inactive region of circuitry integrated in the first semiconductor die 110.

As shown, the one or more first semiconductor dies 110 can include a plurality of first semiconductor dies, which are arranged to be horizontally spaced a predetermined distance apart from each other. Accordingly, the third surfaces 113 of the first semiconductor dies 110 can be disposed to face each other. In addition, for example, the first semiconductor die 110 can include one more integrated circuits selected from logic circuits, micro control units, memory, digital signal processors, network processors, power management units, audio processors, RF circuits, wireless baseband system on chip processors, application specific integrated circuits, and equivalents thereof.

The first encapsulant 120 can include a substantially planar first surface 121 adjacent to and coplanar with the first surface 111 while surrounding the first semiconductor die 110. The first encapsulant 120 can further include a substantially planar second surface 122 opposite to the first surface 121. The first encapsulant 120 can also include a third surface 123 connecting the first surface 121 and the second surface 122 to each other.

The second surface 122 of the first encapsulant 120 can be vertically spaced a predetermined distance apart from the second surface 112 of the first semiconductor die 110. In particular, the first encapsulant 120 can have a predetermined thickness in a substantially vertical direction with respect to the second surface 112 of the first semiconductor die 110.

In some embodiments, the first encapsulant 120 can comprise non-conductive materials such as a resin, an organic resin, an inorganic filler, a curing agent, a catalyst, a coupling agent, a coloring agent, a flame retardant, an epoxy encapsulant resin, a polymer composite material, a polymer having a filler, an epoxy resin, an epoxy acrylate having a filler such as silica or other inorganic material, a mold compound, a silicone resin, and/or a resin-impregnated B-stage pre-preg film, among others. These features of the first encapsulant 120 can also be applied to the second encapsulant 150 and any other encapsulant described herein.

The first redistribution structure 130 can be formed on the first surface 111 of the first semiconductor die 110 and the first surface 121 of the first encapsulant 120 by a fan-out method. In particular, the first redistribution structure 130 can include one or more metal layers 131 that electrically connect the bond pad 114 and the conductive via 170 to each other. The first redistribution structure 130 can further include one or more dielectric layers 132. In one embodiment, the first redistribution structure 130 includes a plurality of metal layers 131 and a plurality of dielectric layers 132 vertically stacked one on another such that a dielectric layer 132 is interposed between and electrically isolates metal layers 131 from one another. The first redistribution structure 130 can further include a plurality of conductive throughholes 133 that each pass through a respective dielectric layer 132 and electrically interconnect metal layers 131 separated by the respective dielectric layer 132.

In some embodiments, each metal layer 131 and/or conductive throughhole 133 can include at least one conductive material selected from the group comprising copper (Cu), Cu alloy, aluminum (Al), Al alloy, gold (Au), Au alloy, platinum (Pt), Pt alloy, silver (Ag), Ag alloy, nickel (Ni), Ni alloy, tin (Sn), Sn alloy, palladium (Pd), Pd alloy, chrome (Cr), Cr alloy, and equivalents thereof. In addition, each dielectric layer 132 can include at least one dielectric material selected from the group comprising polyimide (PI), benzo cyclo butene (BCB), polybenzoxazole (PBO), bismaleimidetriazine (BT), a phenolic resin, epoxy encapsulant compound, epoxy encapsulant resin or equivalents thereof. These features of the first redistribution structure 130 can be commonly applied to the second redistribution structure 160 described below.

The second semiconductor die 140 can include a substantially planar first surface 141, a substantially planar second surface 142 opposite to the first surface 141, and a substantially planar third surface 143 connecting the first surface 141 and the second surface 142 to each other. The second semiconductor die 140 can further include a bond pad 144 formed on the first surface 141.

The first surface 141 can include a passivation layer. In particular, the first surface 141 can correspond to a surface of the passivation layer. Additionally, the first surface 141 can correspond to an active region (e.g., a sensing region), and the second surface 142 can correspond to an inactive region of circuitry integrated in the second semiconductor die 140. In addition, the passivation layer of the first surface 141 can protect the sensing region from external surroundings.

In some embodiments, the second semiconductor die 140 can include sensing circuitry such as, for example, a fingerprint sensor, an optical sensor, a pressure sensor, an accelerometer, a gyro sensor, a MEMS (Microelectromechanical System) device, or equivalents thereof. As such, the second semiconductor die 140 can include a corresponding sensing region on the first surface 141 such as, for example, a fingerprint sensing region, a light sensing region, a pressure sensing region, an acceleration sensing region, or a gyro sensing region.

The second encapsulant 150 can include a substantially planar first surface 151 adjacent to and coplanar with the first surface 141 of the second semiconductor die 140 while surrounding the second semiconductor die 140. The second encapsulant 140 can further include a substantially planar second surface 152 opposite to the first surface 151, and a third surface 153 connecting the first surface 151 and the second surface 152 to each other. The second surface 152 of the second encapsulant 150 can be vertically spaced a predetermined distance apart from the second surface 142 of the second semiconductor die 140. In particular, the second encapsulant 150 can have a predetermined thickness in a substantially vertical direction with respect to the second surface 142 of the second semiconductor die 140.

In addition, physiochemical features of the second encapsulant 150 can be the same, similar, or different from those of the first encapsulant 120. As an example, the modulus of the second encapsulant 150 can be smaller than the modulus of the first encapsulant 120. More specifically, the elastic force of the second encapsulant 150 can be larger than the elastic force of the first encapsulant 120. As a result, the second encapsulant 150 can survive externally applied mechanical impacts and pressures without breaking by varying its outer shape. Such properties are particularly advantageous in safely protecting the semiconductor device 100 when the second semiconductor die 140 is exposed to external surroundings.

Meanwhile, the second surface 122 of the first encapsulant 120 and the second surface 152 of the second encapsulant 150 can be adhered to each other. In an example embodiment, an adhesion layer 180 can be interposed between the second surface 122 of the first encapsulant 120 and the second surface 152 of the second encapsulant 150. In such embodiments, the adhesion layer 180 can comprise a thermally curable epoxy adhesive, a thermally curable epoxy double-sided adhesive, or equivalents thereof.

As shown, the first semiconductor die 110 and the second semiconductor die 140 can be vertically spaced a predetermined distance apart from each other by the first encapsulant 120 and the second encapsulant 150. As such, the second surface 112 of the first semiconductor die 110 and the second surface 142 of the second semiconductor die 140 can be vertically spaced a predetermined distance apart from each other due to the interposed first encapsulant 120 and second encapsulant 150.

The second redistribution structure 160 can be formed on the first surface 141 of the second semiconductor die 140 and the first surface 151 of the second encapsulant 150 by a fan-out method. Similar to the first redistribution structure 130, the second redistribution structure 160 can include one or more metal layers 161 that electrically connects the bond pad 144 to the conductive via 170. The second redistribution structure 160 can further include one or more dielectric layers 162. In one embodiment, the second redistribution structure 160 includes a plurality of metal layers 161 and a plurality of dielectric layers 162 vertically stacked one on another such that a dielectric layer 162 is interposed between and electrically isolates metal layers 161 from one another. The second redistribution structure 160 can further include a plurality of throughholes (not shown) that each pass through respective dielectric layer 162 and electrically interconnect metal layers 161 separated by the respective dielectric layer 162.

As shown, the first surface 111 of the first semiconductor die 110 is completely covered by the first redistribution structure 130. However, unlike the first surface 111, the first surface 141 of the second semiconductor die 140 can not be completely covered by the second redistribution structure 160. In particular, the second redistribution structure 160 exposes a sensing region of the first surface 141 to an environment external to the semiconductor device 100. Therefore, sensing circuitry of the second semiconductor die 140 can sense external surroundings through the sensing region without being hampered by the second redistribution structure 160. Moreover, a side surface of the first redistribution structure 130, the third surface 123 of the first encapsulant 120, a side surface of the adhesion layer 180, the third surface 153 of the second encapsulant 150, and a side surface of the second redistribution structure 160 can be coplanar.

The conductive via 170 can electrically connect the first redistribution structure 130 and the second redistribution structure 160 to each other. To this end, the conductive via 170 can extend through the first encapsulant 120, the adhesion layer 180, and the second encapsulant 150 and electrically connect a metal layer 131 of the first redistribution structure 130 to a metal layer 161 of the second redistribution structure 160. In some embodiments, an organic insulating layer or an inorganic insulating layer can be interposed between the conductive via 170 and each of the first encapsulant 120, the adhesion layer 180, and the second encapsulant 150. Moreover, the conductive via 170 can comprise a conductive material selected from the group comprising copper (Cu), Cu alloy, aluminum (Al), Al alloy, gold (Au), Au alloy, platinum (Pt), Pt alloy, silver (Ag), Ag alloy, nickel (Ni), Ni alloy, tin (Sn), Sn alloy, palladium (Pd), Pd alloy, chrome (Cr), Cr alloy, and equivalents thereof.

Since the first semiconductor die 110 and the second semiconductor die 140 are electrically connected to each other by the conductive via 170, the first semiconductor die 110 can process a signal sensed from the second semiconductor die 140. The first semiconductor die 110 can further transmit the processed signal to an external device via the one or more external interconnection structures 190.

The external interconnection structures 190 can be formed on the first redistribution structure 130 or the second redistribution structure 160. For example, if the first redistribution structure 130 is to be mounted on an external device, the external interconnection structures 190 can be electrically connected to a metal layer 131 of the first redistribution structure 130. Alternatively, if the second redistribution structure 160 is to be mounted on an external device, the external interconnection structures 190 can be electrically connected to a metal layer 161 of the second redistribution structure 160. FIG. 1 illustrates the external interconnection structures 190 formed on the first redistribution structure 130.

In addition, each external interconnection structure 190 can include a metal pillar, a metal pillar having a solder cap, a solder bump, a solder ball, a bump, a land, a flexible circuit board and equivalents thereof. Specifically, an external interconnection structure 190, such as a metal pillar, a solder bump, a solder ball, a bump, or a land, can permit positioning the semiconductor device 100 close to an external device to be connected thereto. By contrast, an external interconnection structure 190, such as a flexible circuit board, can be manufactured to have various shapes and lengths and can permit positioning the semiconductor device 100 further from an external device than for example a bump or land.

As described above, the semiconductor device 100 according to an embodiment of the present disclosure can accommodate both the first semiconductor die 110 for processing signals and the second semiconductor die 140 for sensing signals within a minimum volume space. More specifically, the semiconductor device 100 can provide a very thin 3D package including a sensor, in such a manner that the first semiconductor die 110 (e.g., a logic die, etc.) and the second semiconductor die 140 (e.g., a sensor die, etc.) are vertically stacked between thin first and second redistribution structures 130 and 160 to obtain a relatively thin semiconductor device 100.

In an example embodiment, stacking the first and second semiconductor dies 110 and 140 can reduce approximately 40 to 60% of a horizontal area of the semiconductor device 100, compared to that of the conventional semiconductor device. In addition, the first and second redistribution structures 130 and 160 formed by a fan-out method can reduce approximately 30 to 40% of a vertical thickness of the semiconductor device 100, compared to that of the conventional semiconductor device. In addition, since the area and thickness of the semiconductor device 100 are reduced, the power consumption of the semiconductor device 100 can be reduced while improving the processing speed.

Figure 2:
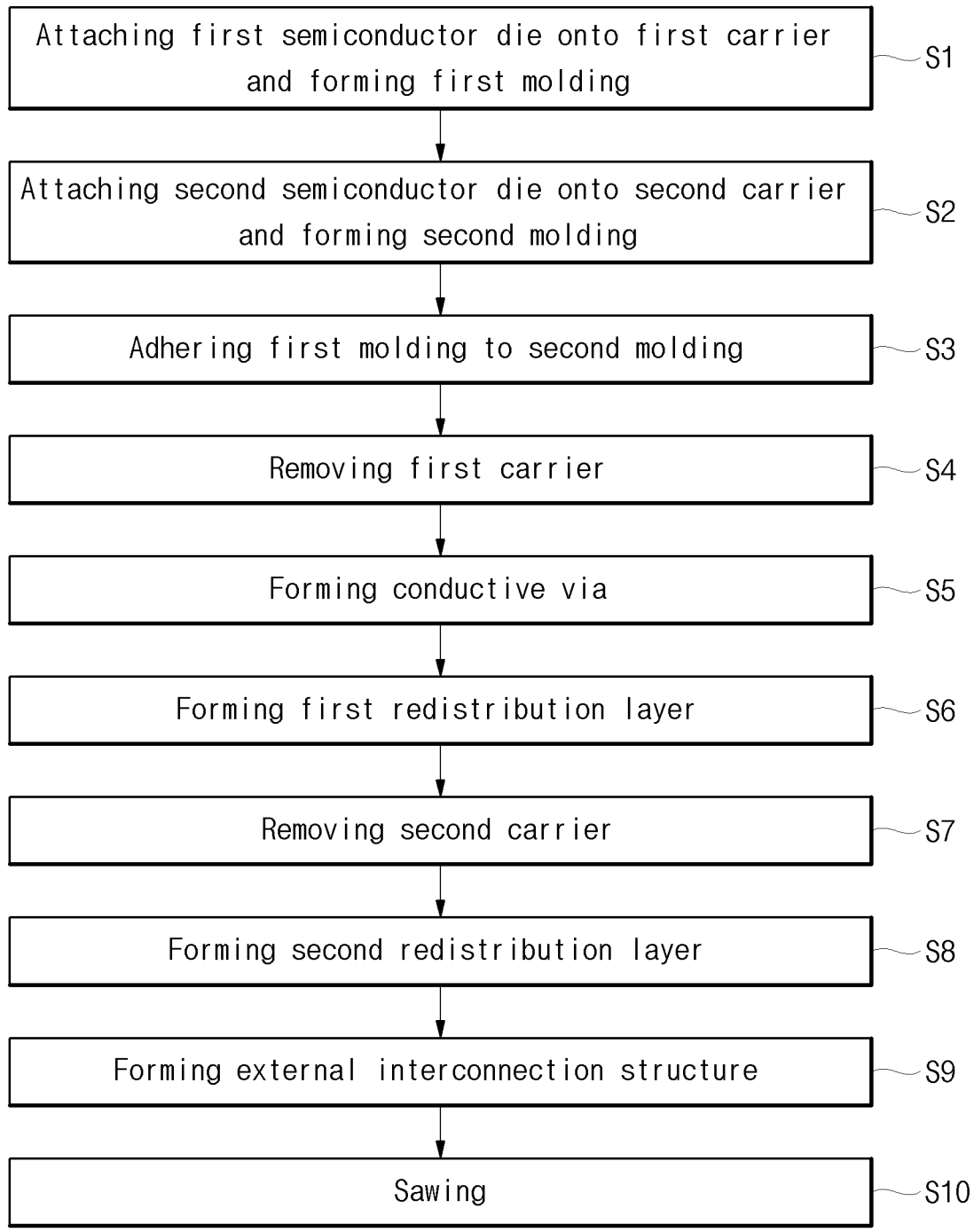
FIG. 2 is a flowchart of a manufacturing method of a semiconductor device according to the example embodiment of FIG. 1.

Referring to FIG. 2, a flowchart of an example method of manufacturing the semiconductor device 100 is illustrated. As illustrated in FIG. 2, the example manufacturing method can include steps of attaching a first semiconductor die onto a first carrier and forming a first encapsulant (step S1), attaching a second semiconductor die onto a second carrier and forming a second encapsulant (step S2), adhering a first encapsulant and a second encapsulant to each other (step S3), removing the first carrier (step S4), forming a conductive via (step S5), forming a first redistribution structure (step S6), removing the second carrier (step S7), forming a second redistribution structure (step S8), forming an external interconnection structure (step S9), and sawing (step S10).

The order of the aforementioned steps can be altered in accordance with certain example embodiments of the manufacturing method. For example, the step S2 can first be performed and the step S1 can then be performed. Alternatively, the step S1 and the step S2 can be simultaneously performed. In another example embodiment, the step S7 can first be performed and the step S5 can then be performed. In still another example embodiment, the step S8 can first be performed and the step S6 can then be performed.

Figure 3A:
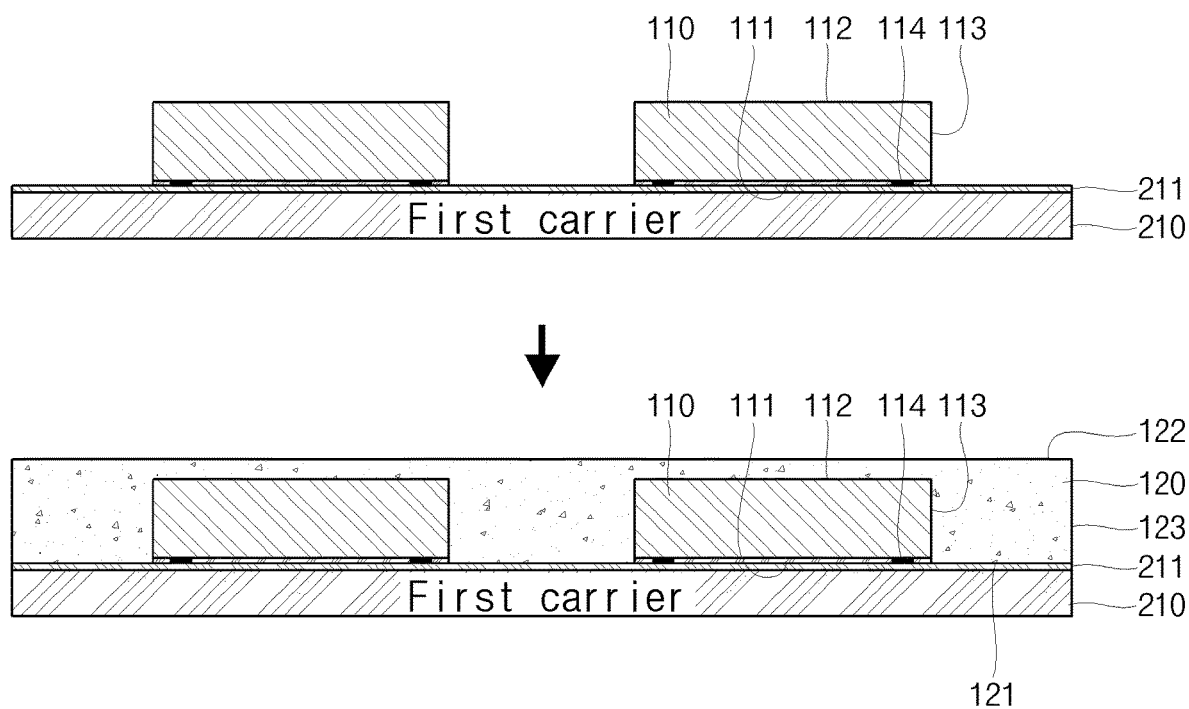
FIGS. 3A to 3J are cross-sectional views illustrating a manufacturing method of a semiconductor device according to the example embodiment of FIG. 1.

Referring to FIGS. 3A to 3J, cross-sectional views illustrating the method of manufacturing the semiconductor device 100 are illustrated. In particular, FIG. 3A illustrates attaching a first semiconductor die 110 onto a first carrier 210 and forming a first encapsulant 120 per step S1. In particular, a first provisional adhesion layer 211 can be formed on the first carrier 210, and a first semiconductor die 110 can be attached onto the first provisional adhesion layer 211. Furthermore, a first encapsulant 120 can be molded over the first semiconductor die 110 disposed on the first provisional adhesion layer 211 such that the first encapsulant 120 surrounds and covers the first semiconductor die 110 and the first provisional adhesion layer 211.

In some embodiments, the first carrier 210 can comprise glass, a low-grade silicon wafer, metal (e.g., copper, aluminum, stainless steel, nickel, etc.), ceramic (e.g., alumina, silicon carbide, aluminum nitride, zirconium oxide, etc.), and equivalents thereof. The first carrier 210 can be surface-treated to allow the first provisional adhesion layer 211 to have an appropriate adhesive force. In an example embodiment, the first carrier 210 can have a surface roughness of approximately 2 µm or less and can have a diameter between 200 mm and 300 mm, which is similar to a standard semiconductor wafer size. In addition, the first carrier 210 can be ground, for example, only in a certain direction, to ease the removal/release of the first provisional adhesion layer 211 from the first carrier in a subsequent step. For example, the first carrier 210 can have an anodized surface. The first carrier 210 can include, for example, a metal alloy capable of operating to withstand a large temperature change without distortion and representing minimum surface corrosion over time. These features of the first carrier 210 can also be applied to a second carrier 220 described below.

The first provisional adhesion layer 211 (or an adhesive film) can include, for example, a heat-sensitive double-sided tape that adheres the first semiconductor die 110 (e.g., a sawed or singulated die) to the first carrier 210. In some embodiments, the first provisional adhesion layer 211 can include a heat-releasable tape, that exhibits reduced adhesion at a temperature in the range of approximately 90° C. to approximately 200° C. Such a heat-releasable tape can include a foam adhesive, a polyether film, and a base adhesive sandwiched between liner layers such as, for example, an adhesive tape manufactured by Nitto Denko under the trade name of REVALPHA. As an example, the heat-releasable tape can include an approximately 75 µm thick polyester liner, an approximately 10 µm thick base adhesive, an approximately 40 µm thick polyester film, an approximately 50 µm thick foam adhesive, and an approximately 40 µm thick polyester liner.

In some embodiments, the first provisional adhesion layer 211 can withstand a temperature change and can maintain its adhesive force at high temperatures during subsequent processes (e.g., semiconductor die attaching and/or encapsulating). In addition, the first provisional adhesion layer 211 can withstand a compressive load during subsequent semiconductor die attaching and/or encapsulating processes. For example, the first semiconductor die 110, attached during such a compression process (for example, in the step of attaching the semiconductor die), can preferably penetrate a plane of the first provisional adhesion layer 211 as minimally as possible, thereby maintaining flatness or coplanarity between a die surface and a encapsulant surface. These features of the first provisional adhesion layer 211 can also apply to the second provisional adhesion layer 221 described below.

As shown in FIG. 3A, the first surface 111 and the bond pad 114 of the first semiconductor die 110 can be directly adhered to the first provisional adhesion layer 211. Moreover, the first surface 111 and the bond pad 114 of the first semiconductor die 110 need not excessively penetrate into or compress the first provisional adhesion layer 211. In addition, the first encapsulant 120 can be formed to surround the first semiconductor die 110 disposed on the first provisional adhesion layer 211. Therefore, the first surface 111 of the first semiconductor die 110 and the first surface 121 of the first encapsulant 120 become coplanar with each other. In some embodiments, the first encapsulant 120 can be formed by compression molding (e.g., a process using liquid, powder, and/or a film), vacuum molding, transfer molding, injection molding, or the like.

In addition, the first encapsulant 120 can have a predetermined thickness in which the second surface 122 is offset in a substantially vertical direction from the second surface 112 of the first semiconductor die 110. In particular, the second surface 122 of the first encapsulant 120 can be vertically spaced a predetermined distance apart from the second surface 112 of the first semiconductor die 110. In some cases, however, a predetermined region of the first encapsulant 120 can be removed by mechanical and/or chemical grinding processes. Such removal can result in the second surface 122 of the first encapsulant 120 being coplanar with the second surface 112 of the first semiconductor die 110.

FIG. 3A depicts only two first semiconductor dies 110 attached to and molded on the first carrier 210 and the first provisional adhesion layer 211. However, in some embodiments, many more first semiconductor dies 110 (e.g., 10 to 100) can be horizontally arrayed, attached, and molded on the first carrier 210 and the first provisional adhesion layer 211.

Figure 3B:
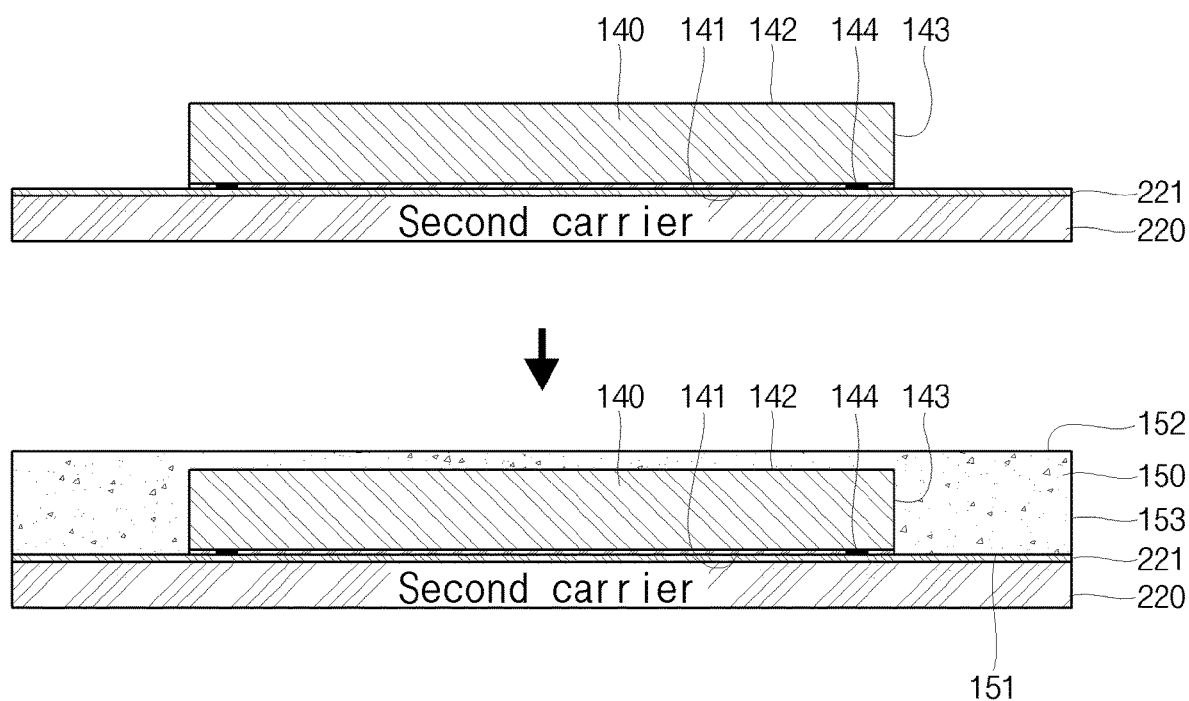

As illustrated in FIG. 3B, step S2 can include attaching the second semiconductor die 140 onto the second carrier 220 and forming a second encapsulant 150. More specifically, a second provisional adhesion layer 221 can be formed on the second carrier 220 and a second semiconductor die 140 can be attached onto the second provisional adhesion layer 221. Furthermore, a second encapsulant 150 can be molded over the second semiconductor die 140 disposed on the second provisional adhesion layer 221 such that the second encapsulant 150 surrounds and covers the second semiconductor die 140 and the second provisional adhesion layer 221. These features of the second provisional adhesion layer 221 can be the same or similar to those of the first provisional adhesion layer 211 and the first carrier 210 described above.

In some embodiments, the first surface 141 and the bond pad 144 of the second semiconductor die 140 can be directly adhered to the second provisional adhesion layer 221. Moreover, the first surface 141 and the bond pad 144 of the second semiconductor die 140 need not excessively penetrate into or compress the second provisional adhesion layer 221. In addition, the second encapsulant 150 can be formed to surround the second semiconductor die 140 disposed on the second provisional adhesion layer 221. Therefore, the first surface 141 of the second semiconductor die 140 and the first surface 151 of the second encapsulant 150 are coplanar with each other.

In addition, the second encapsulant 150 can have a predetermined thickness in which the second surface 152 is offset in a substantially vertical direction from the second surface 142 of the second semiconductor die 140. In particular, the second surface 152 of the second encapsulant 150 can be vertically spaced a predetermined distance apart from the second surface 142 of the second semiconductor die 140. In some cases, however, a predetermined region of the second encapsulant 150 can be removed by a grinding and/or etching process. Such removal can result in the second surface 152 of the second encapsulant 150 being coplanar with the second surface 142 of the second semiconductor die 140.

FIG. 3B depicts only one second semiconductor die 140 attached to and molded on the second carrier 220 and the second provisional adhesion layer 221. However, in some embodiments, many more second semiconductor dies 140

(e.g., 5 to 50) can be horizontally arrayed, attached, and molded on the second carrier 220 and the second provisional adhesion layer 221.

Figure 3C:
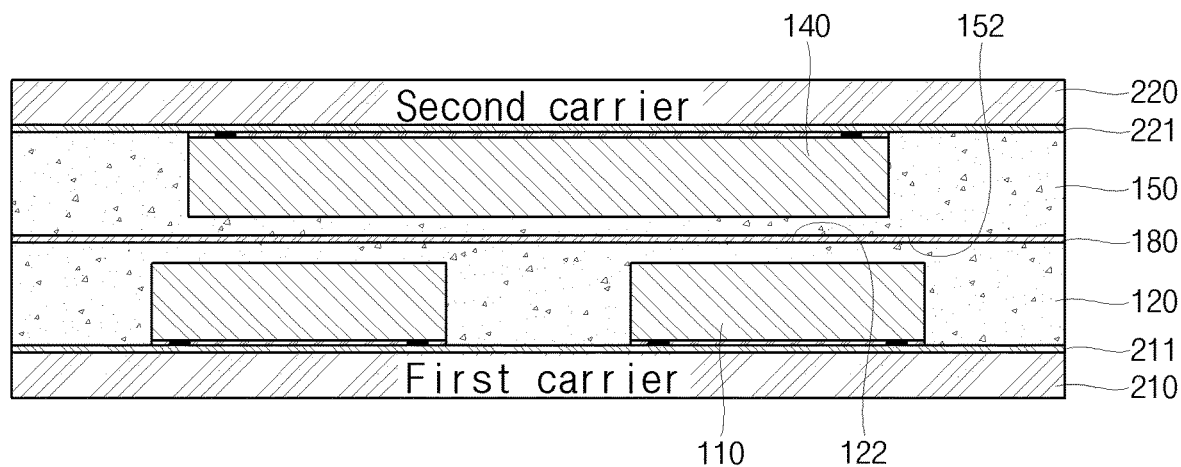

As illustrated in FIG. 3C, step S3 can include adhering the first encapsulant 120 and the second encapsulant 150 to each other. To this end, an adhesion layer 180 can be interposed between the first encapsulant 120 and the second encapsulant 150, so that the first encapsulant 120 and the second encapsulant 150 are adhered to each other. More specifically, the second surface 122 of the first encapsulant 120 and the second surface 152 of the second encapsulant 150 can be adhered to each other while the adhesion layer 180 is interposed therebetween.

In some embodiments, the adhesion layer 180 can be cured by applying a temperature in the range of approximately 100° C. to approximately 200° C. and a pressure in the range of 1 MPa to 100 MPa. In particular, after the adhesion layer 180 is interposed between the first encapsulant 120 and the second encapsulant 150, the first encapsulant 120 and the second encapsulant 150 can be positioned between an upper mold and a lower mold each having a heater mounted thereon. Next, the temperature in the range of approximately 100° C. to approximately 200° C. and the pressure in the range of 1 MPa to 100 MPa can be applied through the upper and lower molds.

Meanwhile, the operating temperatures of the die attaching and encapsulant processes are preferably lower than temperatures of releasing the first and second provisional adhesion layers 211 and 221. For example, if the first and second provisional adhesion layers 211 and 221 are released at a temperature of approximately 200° C., then the operating temperatures of the die attaching and encapsulant processes are preferably lower than of approximately 200° C.

Additionally, for the sake of convenient processing, the first provisional adhesion layer 211 and the second provisional adhesion layer 221 can be released at different temperatures. For example, if the first provisional adhesion layer 211 is released at approximately 190° C., then the second provisional adhesion layer 221 can be released at approximately 200° C. In such an embodiment, after the first provisional adhesion layer 211 is released, the second semiconductor die 140 and the second encapsulant 150 can remain adhered to the second provisional adhesion layer 221. In particular, the second provisional layer 221 can remain adhered during formation of the conductive via 170 and the first redistribution structure 130, thereby preventing the second semiconductor die 140 and the second encapsulant 150 from being contaminated by external surroundings.

Figure 3D:
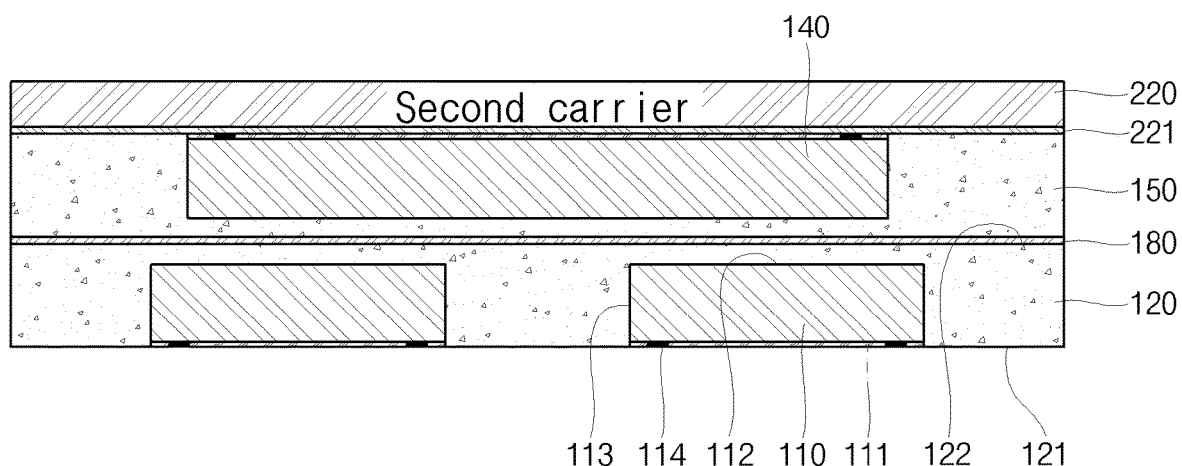

As illustrated in FIG. 3D, step S4 can include removing the first carrier 210 and the first provisional adhesion layer 211 from the first semiconductor die 110 and the first encapsulant 120. To this end, the first provisional adhesion layer 211 can be heated until the first carrier 210 is separated from the first semiconductor die 110 and the first encapsulant 120. After heating the first provisional adhesion layer 211, the first carrier 210 and the first provisional adhesion layer 211 are released and removed from the first semiconductor die 110 and the first encapsulant 120. In particular, the first provisional adhesion layer 211 need not remain on the first surface 111 of the first semiconductor die 110 and the first surface 121 of the first encapsulant 120. As described above, the first carrier 210 can be ground in a certain direction. Such grinding can result in the first provisional adhesion layer 211 remaining adhered to the first carrier while releasing its adhesion to the first semiconductor die 110 and the first encapsulant 120.

As shown, after removal of the first provisional adhesion layer 211, the first surface 111 of the first semiconductor die 110 and the first surface 121 of the first encapsulant 120 are coplanar with each other and are exposed. In particular, removal of the first provisional adhesion layer 211 exposes the first surface 111 (e.g., the first die passivation layer) and the bond pad 114 of the first semiconductor die 110 to an environment external to the semiconductor device 100.

Figure 3E:
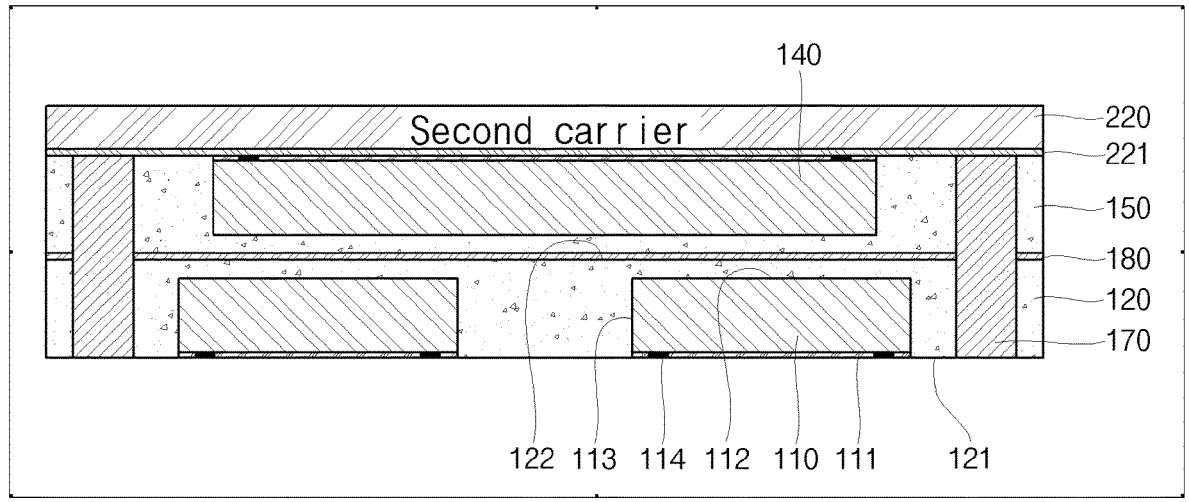

As illustrated in FIG. 3E, step S5 can include forming a conductive via 170 that extends through the first encapsulant 120, the adhesion layer 180, and the second encapsulant 150. In an example embodiment, a laser beam, mechanical drilling, or chemical etching are used to form throughholes that extend through the first encapsulant 120, the adhesion layer 180, and the second encapsulant 150. Moreover, such throughholes can be filled with a conductive material to form the conductive vias 170 in the throughholes. In particular, the conductive via 170 can be formed in the throughholes using various processes such as, for example, electroless plating, electroplating, or sputtering. In some embodiments, an insulating layer can be formed in the throughhole using an organic material and/or an inorganic material, and then the conductive via 170 can be formed on the interior surface of the insulating layer. Regardless, the conductive material can include copper (Cu), Cu alloy, aluminum (Al), Al alloy, gold (Au), Au alloy, platinum (Pt), Pt alloy, silver (Ag), Ag alloy, nickel (Ni), Ni alloy, tin (Sn), Sn alloy, palladium (Pd), Pd alloy, chrome (Cr), Cr alloy, and equivalents thereof.

Figure 3F:
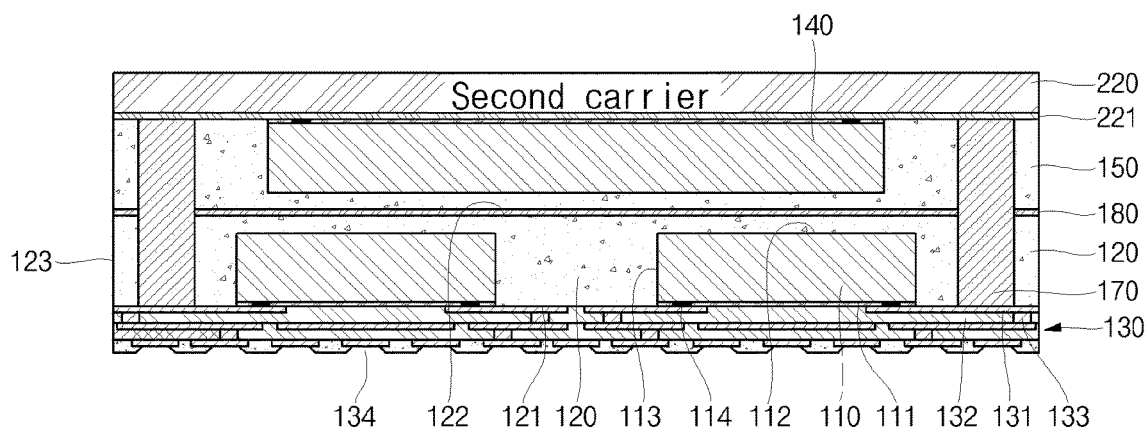

As illustrated in FIG. 3F, step S6 can include forming a first redistribution structure 130 on the first surface 111 of the first semiconductor die 110 and the first surface 121 of the first encapsulant 120 by a fan-out method. In particular, a metal layer 131 of the first redistribution structure 130 can be formed to electrically connect a bond pad 114 of the first semiconductor die 110 to a conductive via 170. To this end, the metal layer 131 can be formed on the first surface 111 of the first semiconductor die 110 and the first surface 121 of the first encapsulant 120 by electroless plating, electroplating, or sputtering. The metal layer 131 can be further patterned or routed by a subsequent photolithographic etching process.

Furthermore, a dielectric layer 132 can be formed on the first surface 111 of the first semiconductor device 110, the first surface 121 of the first encapsulant, and on the patterned metal layer 131. In particular, the dielectric layer 132 can be formed using various processes such as spin coating, spray coating, deep coating, etc. As shown the first redistribution structure 130 can have a multi-layered structure. In particular, the first redistribution structure 130 can comprise a plurality of metal layers 131 and dielectric layers 132 vertically stacked one on another. Furthermore, the first redistribution structure can include a plurality of conductive throughholes 133 that pass through respective dielectric layers 132 in order to electrically connect metal layers 131 otherwise separated by the respective dielectric layer 132. FIG. 3F illustrates an embodiment of the first redistribution structure 130 comprising three metal layers 131 and three dielectric layers 132. However, other embodiments of the first redistribution structure 130 can include a different number of metal layers 131 and/or dielectric layers 132.

FIG. 3F further depicts openings 134 formed in the bottom-most dielectric layer 132. In particular, the openings 134 can be formed using a photolithographic process or another process. Moreover, each opening 134 can expose a predetermined region of a metal layer 131. Such exposure can permit electrically connecting external interconnection structures 190 to exposed regions of the metal layer 131.

Figure 3G:
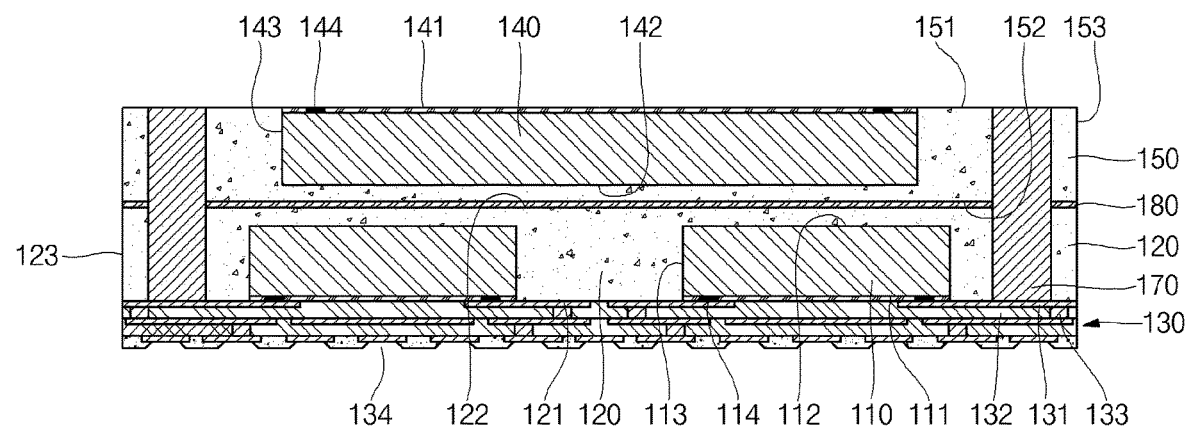

As illustrated in FIG. 3G, step S7 can include removing the second carrier 220 and the second provisional adhesion layer 221 from the second semiconductor die 140 and the second encapsulant 150. In particular, the second provisional adhesion layer 221 can be heated until the adhesion between the second carrier 220 and the second semiconductor die 140 and the second encapsulant 150 is removed or reduced. After the heating, the second carrier 220 and the second provisional adhesion layer 221 can be separated from the second semiconductor die 140 and the second encapsulant 150. Such removal can expose the first surface 141 of the second semiconductor die 140, the first surface 151 of the second encapsulant 150, and a surface of the conductive via 170 to an environment external to the semiconductor device 100. Moreover, such removal can result in the first surface 141, the first surface 151, and the surface of the conductive via 170 being coplanar with each other.

Figure 3H:
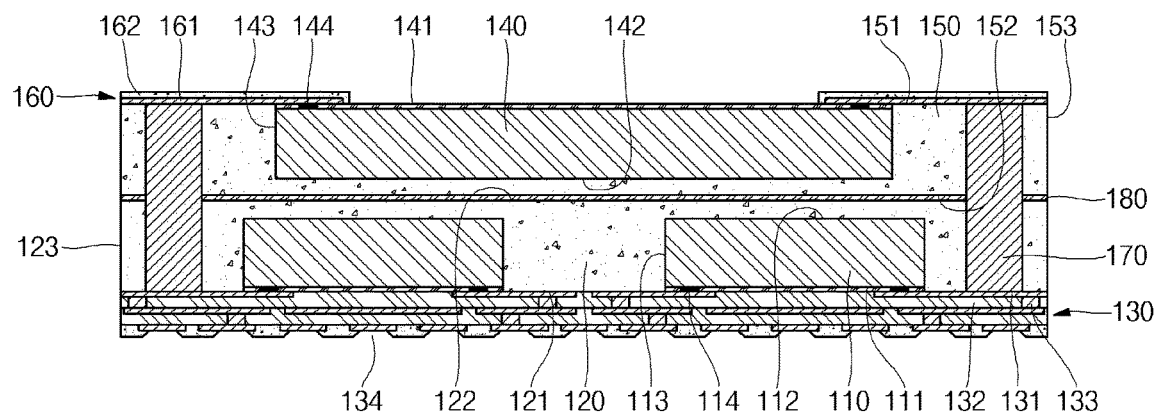

As illustrated in FIG. 3H, step S8 can include forming a second redistribution structure 160 on the first surface 141 of the second semiconductor die 140 and the first surface 151 of the second encapsulant 150 by a fan-out method. In particular, a metal layer 161 of the second redistribution structure 160 can electrically connect a bond pad 144 of the second semiconductor die 140 to a conductive via 170. In addition, a second dielectric layer 162 can be formed on the first surface 141 of the second semiconductor die, the first surface 151 of the second encapsulant, and the metal layer 161. As illustrated, the second redistribution structure 150 comprises a single metal layer 161 and a single dielectric layer 162. However, in other embodiments, the second redistribution structure 160 can comprise a multi-layered structure similar to the first redistribution structure 130 described above. As the result of the above-described process, the first redistribution structure 130 and the second redistribution structure 160 can be electrically connected to each other by the conductive via 170.

As described above, the first redistribution structure 130 and second redistribution structure 160 are formed in situ via a fan-out method. However, in various embodiments, the first redistribution structure 130 and/or the second redistribution structure 160 can utilize a printed circuit board or other pre-built structure instead being formed via an in situ fan-out method.

As further illustrated in FIG. 3H, the second redistribution structure 160 can expose a sensing region of the first surface 141 of the second semiconductor die 140 to an environment external to the semiconductor device 100. In particular, the second redistribution structure 160 need not cover the sensing region of the first surface 141 of the second semiconductor die 140 to permit directly sensing external phenomena through the sensing region. In some embodiments, a protection member or layer can further be attached onto the second redistribution structure 160 and the first surface 141 of the second semiconductor die 140 to protect the sensing region of the first surface 141 from external surroundings.

Figure 3I:
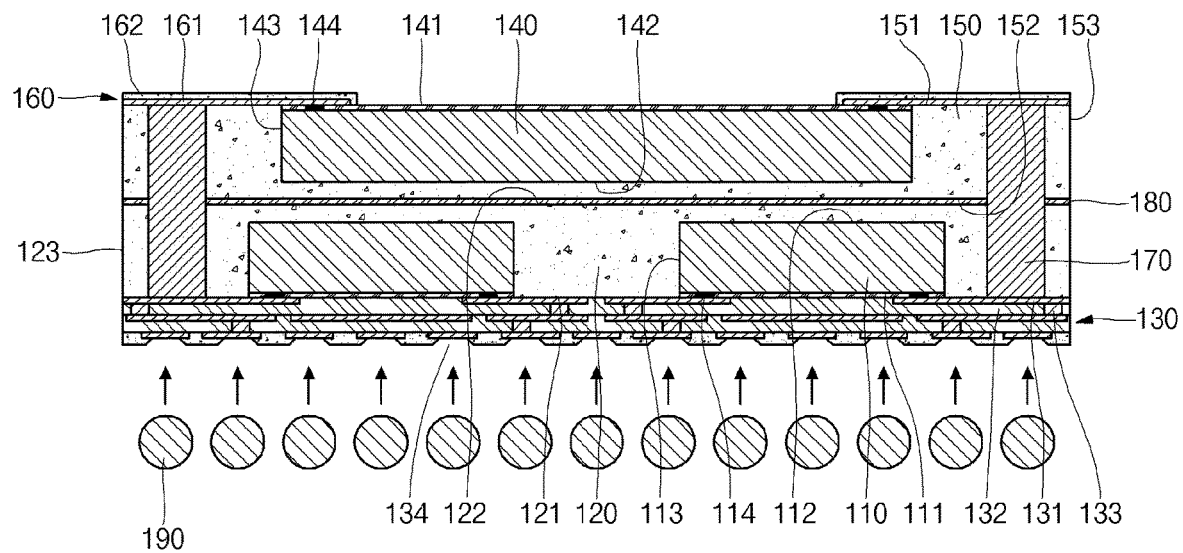

As illustrated in FIG. 3I, step S9 can include forming external interconnection structures 190 that are electrically connected to the first redistribution structure 130. In particular, forming the interconnection structures 190 can include forming one or more metal pillars, solder bumps, solder balls, bumps, lands, or flexible circuit boards electrically connected to regions of the metal layer 131 exposed by the openings 134 formed in the dielectric layer 132. In the exemplary embodiment, the external interconnection structures 190 are attached to the first redistribution structure 130.

However, in some embodiments, the external interconnection structures 190 can be attached to the second redistribution structure 160 instead of, or in addition to, the first redistribution structure 130.

Figure 3J:
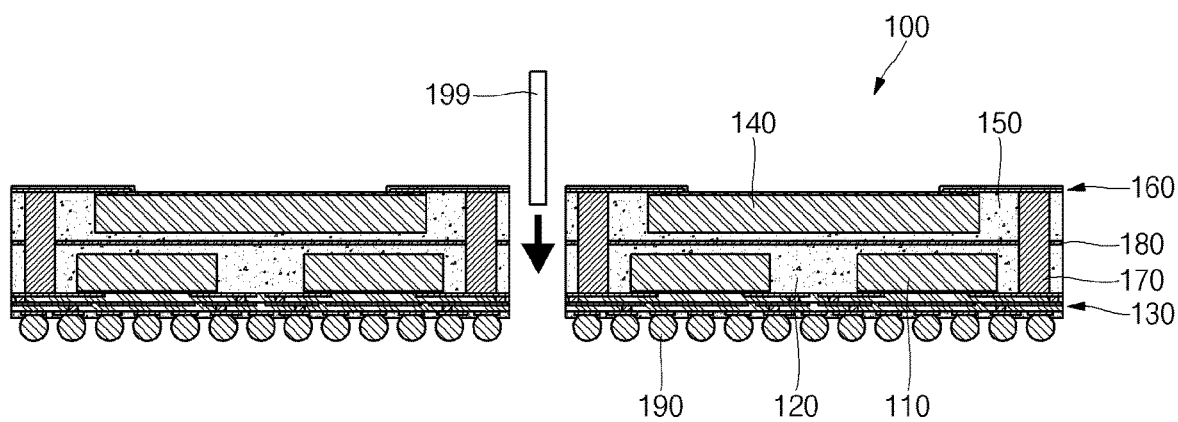

As illustrated in FIG. 3J, step S10 can include sawing the first redistribution structure 130, the first encapsulant 120, the adhesion layer 180, the second encapsulant 150, and the second redistribution structure 160 using a sawing tool 199 in order to provide individual semiconductor devices 100. In particular, the semiconductor device 100 can be fabricated in a manner that arranges multiple devices 110 in a strip or matrix configuration to improve productivity. Sawing, dicing, or other singulation processing can be performed at a terminal stage of the manufacturing process in order to separate the integrated devices into individual semiconductor devices 100.

A heat-releasable tape, as a provisional adhesion layer 211, 221, has been described in the illustrated embodiment of the present disclosure. However, a UV releasable tape can also be used as a provisional adhesion layer 211, 221. In such an embodiment, a carrier 210, 220 can be formed from transmissive material such as glass through which UV radiation can pass in order to release or reduce adhesion.

Figure 4:
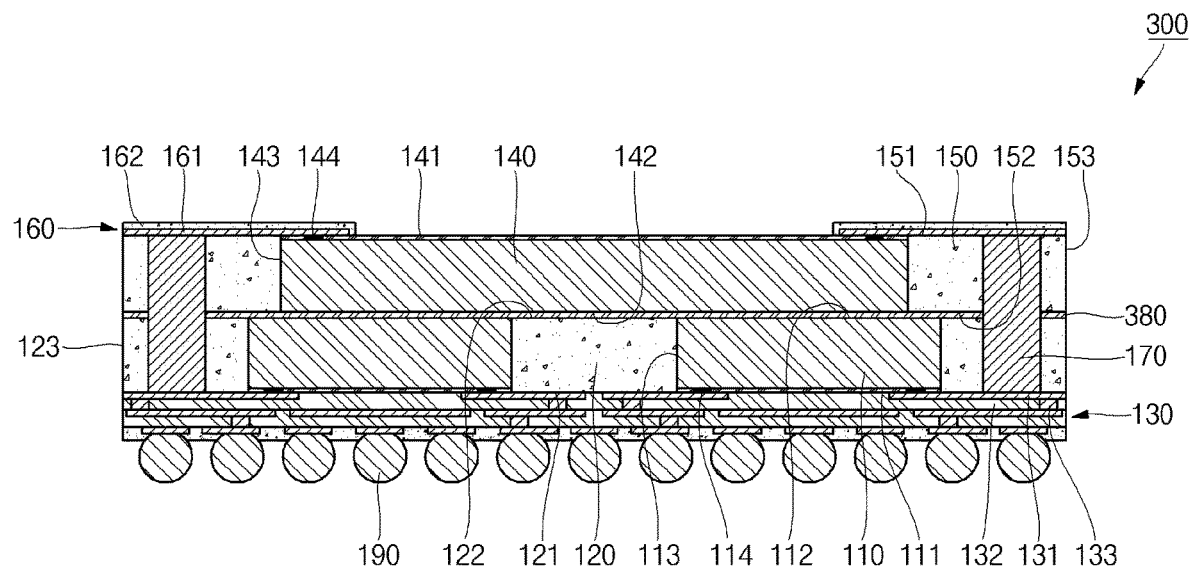
FIG. 4 is a cross-sectional view of a semiconductor device according to another example embodiment of the present disclosure.

Referring to FIG. 4, a cross-sectional view of a semiconductor device 300 according to an example embodiment of the present disclosure is illustrated. Since the semiconductor device 300 illustrated in FIG. 4 is similar to semiconductor device 100 illustrated in FIG. 1, the following focuses on differences between the devices.

Unlike semiconductor device 100, the second surface 112 of the first semiconductor die 110 for semiconductor device 300 can be adhered to the second surface 142 of the second semiconductor die 140 by an adhesion layer 380. As illustrated in FIG. 1, the semiconductor device 100 includes encapsulant material of a predetermined thickness between the second surface 112 of the first semiconductor die 110 and the second surface 122 of the first encapsulant 120, and encapsulant material of a predetermined thickness between the second surface 142 of the second semiconductor die 140 and the second surface 152 of the second encapsulant 150. However, in the semiconductor device 300 illustrated in FIG. 4, the second surface 112 of the first semiconductor die 110 and the first surface 121 of the first encapsulant 120 are coplanar with each other, and the second surface 142 of the second semiconductor die 140 and the second surface 152 of the second encapsulant 150 are coplanar with each other. Therefore, the semiconductor device 300 can achieve a slimmer profile than the semiconductor device 100.

Figure 5A:
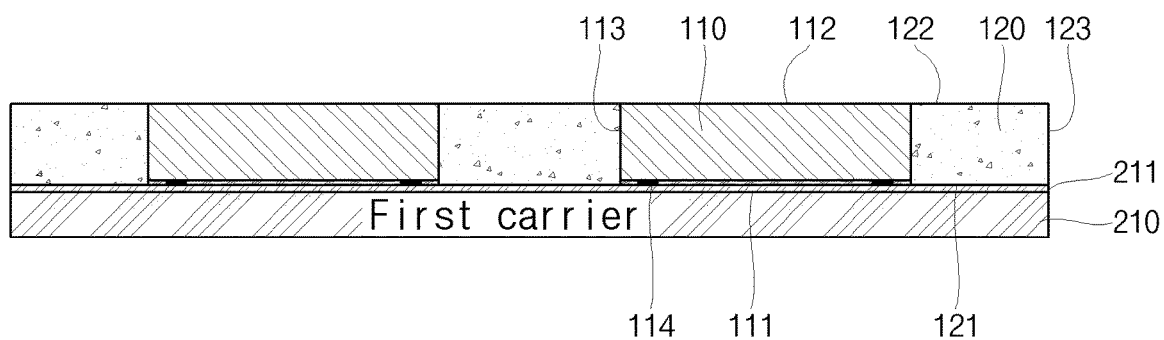
FIGS. 5A to 5C are cross-sectional views illustrating a manufacturing method of a semiconductor device according to the example embodiment of FIG. 4.
Figure 5B:
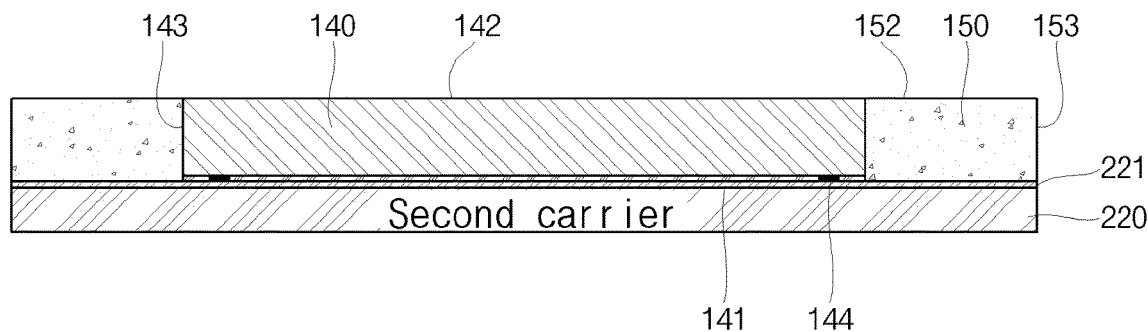
Figure 5C:
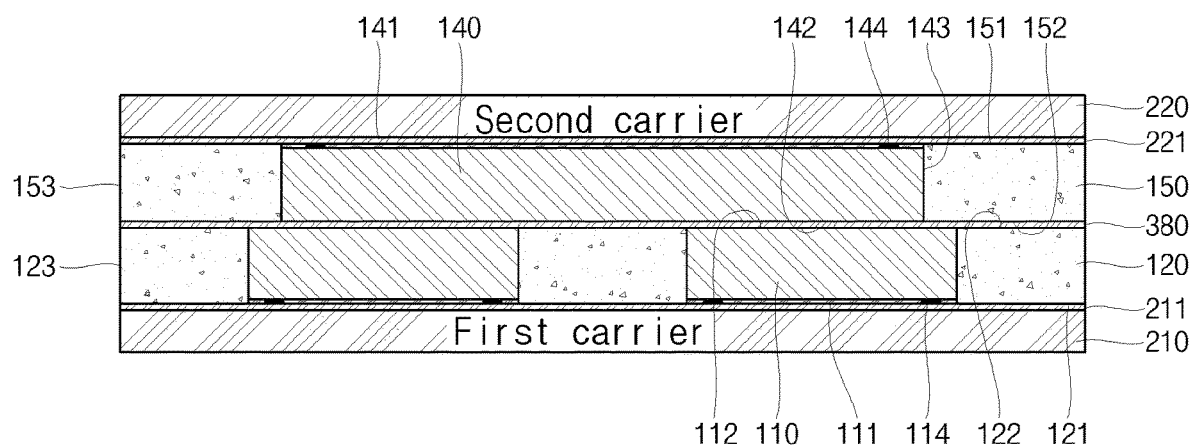

Referring to FIGS. 5A to 5C, cross-sectional views illustrating a method of manufacturing the semiconductor device 300 are illustrated. As illustrated in FIG. 5A, after attaching a first semiconductor die 110 to a first carrier 210 and forming a first encapsulant 120, the first encapsulant 120 can be subjected to a grinding and/or etching process. Such process can result in a second surface 112 of the first semiconductor die 110 and a second surface 122 of the first encapsulant 120 to be coplanar with each other. Moreover, such process can expose the second surface 112 of the first semiconductor die 110 and the second surface 122 of the first encapsulant 120 to an environment external to the semiconductor device 300.

As illustrated in FIG. 5B, after attaching a second semiconductor die 140 to a second carrier 220 and forming a second encapsulant 150, the second encapsulant 150 can be subjected to a grinding and/or etching process that results in a second surface 142 of the second semiconductor die 140 and a second surface 152 of the second encapsulant 150 being coplanar with each other. In particular, such process can expose the second surface 142 of the second semiconductor die 140 an the second surface 152 of the second encapsulant 150 to and environment external to the semiconductor device 300.

As illustrated in FIG. 5C, an adhesion layer 380 can be interposed between the first semiconductor die 110 and the second semiconductor die 120. In particular, the adhesion layer 380 can adhere the second surface 112 of the first semiconductor die 110 and the second surface 122 of the first encapsulant 120 to the second surface 142 of the second semiconductor die 140 and the second surface 152 of the second encapsulant 150. That is to say, the second surface 142 of the second semiconductor die 140 can be generally adhered to the second surface 112 of the first semiconductor die 110, and the second surface 152 of the second encapsulant 150 can be generally adhered to the second surface 122 of the first encapsulant 120.

Thereafter, heating and pressing processes can be performed to further integrate the first semiconductor die 110, the first encapsulant 120, the second semiconductor die 140, and the second encapsulant 150 via the adhesion layer 380. Additionally, after completing the above-described processes, the manufacturing method can include several subsequent processes to attain the semiconductor device of FIG. 4. For example, the method can further include forming of a first redistribution structure 130, forming a conductive via 170, forming a second redistribution structure 160, and forming external interconnection structures 190 in a manner similar to the method of manufacturing the semiconductor device 100.

Figure 6:
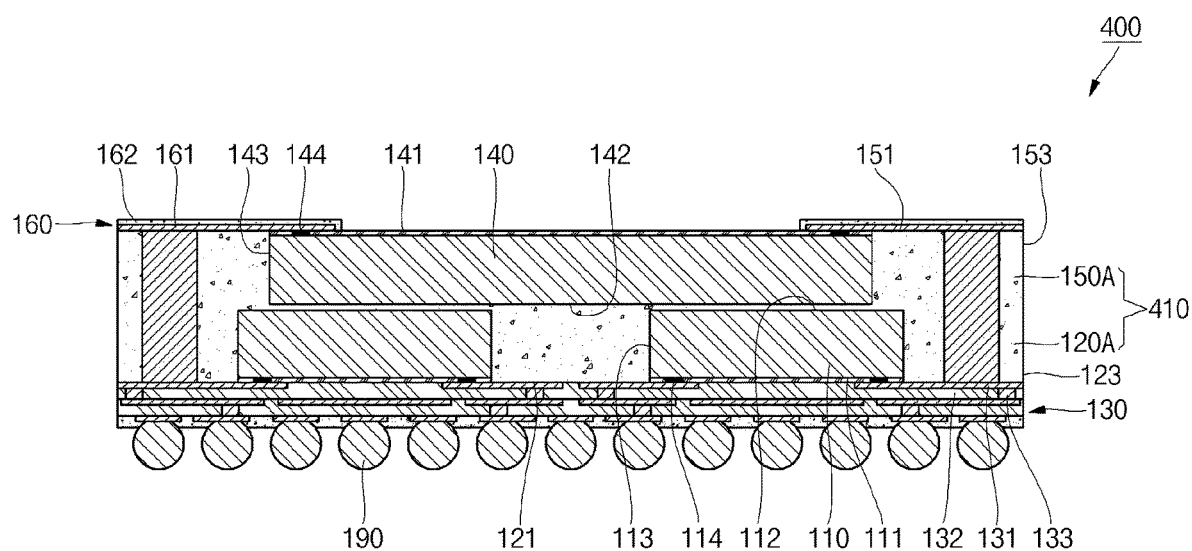
FIG. 6 is a cross-sectional view of a semiconductor device according to yet another example embodiment of the present disclosure.

Referring to FIG. 6, a cross-sectional view of a semiconductor device 400 according to an example embodiment of the present disclosure is illustrated. Since the semiconductor device 400 illustrated in FIG. 6 is similar to the semiconductor device 300 illustrated in FIG. 4, the following focuses on the differences between the semiconductors devices 300, 400.

As illustrated in FIG. 6, a first semiconductor die 110 of the semiconductor device can be adhered to a second semiconductor die 140 by a first encapsulant 120A and/or a second encapsulant 150A. A boundary between the first encapsulant 120A and/or the second encapsulant 150A need not be observed or need not exist. More specifically, the first encapsulant 120A and the second encapsulant 150A can be integrated, thereby forming a single encapsulant 410.

In addition, the second surface 112 of the first semiconductor die 110 and the second surface 142 of the second semiconductor die 140 can be spaced a predetermined distance apart from each other. In particular, resin materials of the first encapsulant 120A and/or the second encapsulant 150A can be interposed between the second surface 112 of the first semiconductor die 110 and the second surface 142 of the second semiconductor die 140. In some embodiments, resin and filler materials can be interposed together between the second surface 112 of the first semiconductor die 110 and the second surface 142 of the second semiconductor die 140.

While FIG. 6 depicts portions of the encapsulant 410 between the first and second semiconductor dies, the second surface 112 of the first semiconductor die 110 in some embodiments can be directly adhered to or in contact with the second surface 142 of the second semiconductor die 140. More specifically, the silicon surface of the first semiconductor die 110 can be directly adhered to or in direct contact with the silicon surface of the second semiconductor die 140.

Since an interfacial surface or an adhesion layer does not exist at the boundary between the first encapsulant 120A and the second encapsulant 150A, moisture is prevented from penetrating into the interfacial surface or the adhesion layer. Moreover, since an interfacial surface or an adhesion layer is not externally observed between the first encapsulant 120A and the second encapsulant 150A, the semiconductor device 400 can enjoy an improved or more visually appealing a product exterior.

Figure 7:
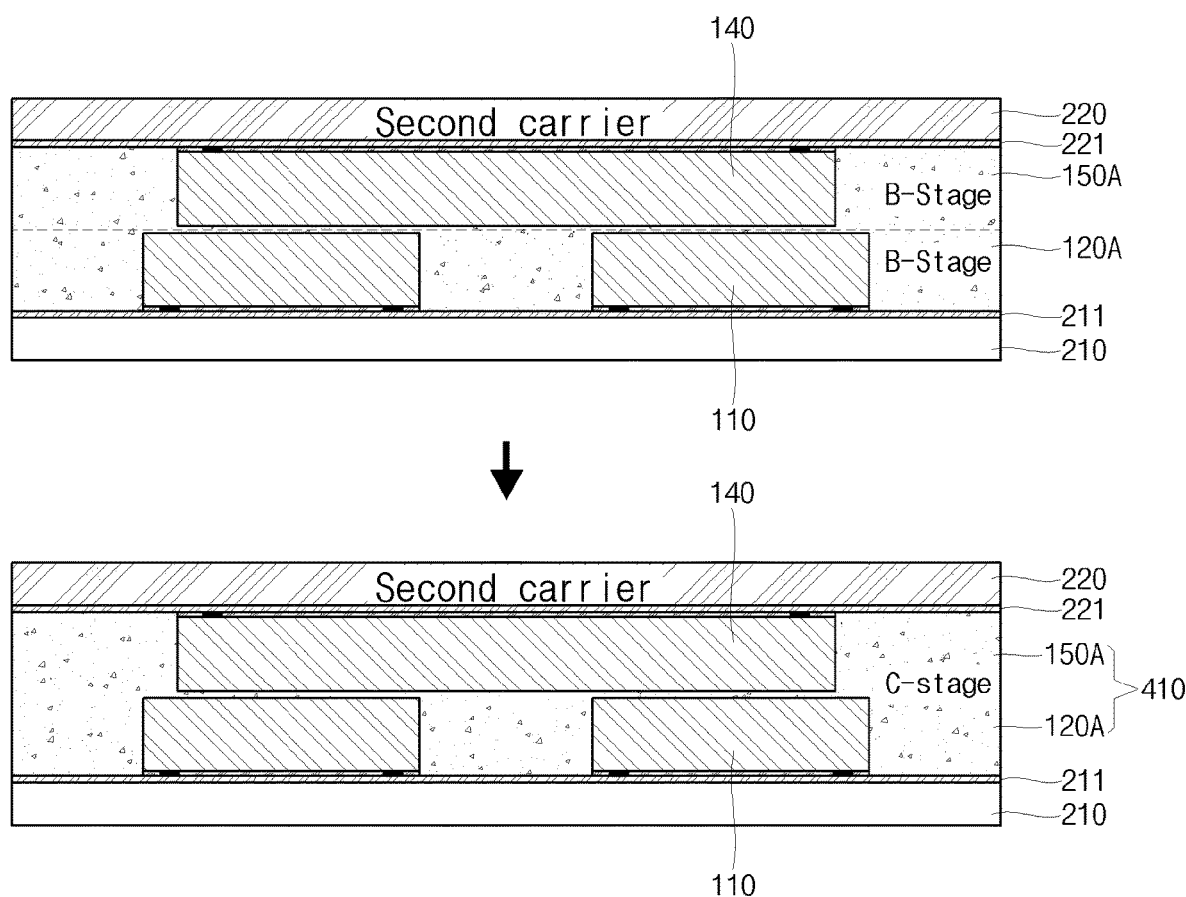
FIG. 7 illustrates cross-sectional views of a manufacturing method of the semiconductor device of FIG. 6.

Referring to FIG. 7, cross-sectional views of a manufacturing method of the semiconductor device 400 are illustrated. As illustrated in FIG. 7, the manufacturing method can include encapsulating a first semiconductor die 110 disposed on a first carrier 210 using a first encapsulant 120A (or a first pre-preg) in a B-stage. The method can further include encapsulating a second semiconductor die 140 disposed on a second carrier 220 by a second encapsulant 150A (or a second pre-preg) in the B-stage. The method can also include adhering the first encapsulant 120A and the second encapsulant 150A to each other. In one embodiment, the first and second encapsulants 120A and 150A in the B-stage are semi-cured and soft. As such, the first and second encapsulants 120A and 150A can be adhered to each other when appropriately heated and pressed. In such a manner, the first and second encapsulants 120A and 150A can be integrated into a single encapsulant 410 without a boundary line existing therebetween. Thus, the first and second encapsulants 120A and 150A can be adhered to each other, and the first and second semiconductor dies 110 and 140 can come into contact with each other.

As noted above, the first encapsulant 120A and the second encapsulant 150A can be heated and pressed. Such heating and pressing can cause the first and second encapsulants 120A and 150A in the B-stage to undergo a phase change into the first and second encapsulants 120A and 150A in a C-stage, that is, into the single encapsulant 410. In particular, a temperature ranging from approximately 100° C. to approximately 200° C. and a pressure ranging from approximately 1 MPa to approximately 100 MPa can be applied to the first and second encapsulants 120A and 150A to form an integrated, cured encapsulant 410.

After completing the above-described processes, the method can include several subsequent processes to attain the semiconductor device 400. In particular, the method can include forming of a first redistribution structure 130, forming a conductive via 170, forming a second redistribution structure 160, and forming external interconnection structures 190 in a manner similar to the method of manufacturing the semiconductor device 100.

The present disclosure provides exemplary embodiments. The scope of the present disclosure is not limited by these exemplary embodiments. Numerous variations, whether explicitly provided for by the specification or implied by the specification, such as variations in structure, dimension, type of material and manufacturing process, can be implemented by one skilled in the art in view of this disclosure.

What is claimed is:

1. A semiconductor device comprising:
    an upper semiconductor die including a bond pad on a top side of the upper semiconductor die;
    a lower semiconductor die including a bond pad on a bottom side of the lower semiconductor die, wherein a top side of the lower semiconductor die is below a bottom side of the upper semiconductor die;
    an encapsulant contacting and surrounding the upper semiconductor die and the lower semiconductor die, a top side of the encapsulant exposing the bond pad of the upper semiconductor die, and a bottom side of the encapsulant exposing the bond pad of the lower semiconductor die, wherein the encapsulant is interposed between the bottom side the upper semiconductor die and the top side of the lower semiconductor die;

an upper redistribution structure on the upper semiconductor die and the top side of the encapsulant, the upper redistribution structure connected to the bond pad of the upper semiconductor die;

a lower redistribution structure below the lower semiconductor die and the encapsulant and connected to the bond pad of the lower semiconductor die; and a conductive via through the encapsulant, wherein an upper end of the conductive via is coupled to the upper redistribution structure and a lower end of the conductive via is coupled to the lower redistribution structure.

2. The semiconductor device of claim 1, wherein the upper semiconductor die includes one of a fingerprint sensor, an optical sensor, a pressure sensor, an accelerometer, a gyro sensor, or a microelectromechanical systems (MEMS) device.

3. The semiconductor device of claim 1, further comprising:

an external interconnection structure coupled to the lower redistribution structure, wherein the external interconnection structure includes one of a metal pillar, a solder bump, a solder ball, a land, or a flexible circuit board.

4. The semiconductor device of claim 1, wherein:

the lower redistribution structure includes:

a first metal layer on the bottom side of the lower semiconductor die and the bottom side of the encapsulant, the first metal layer connecting the bond pad of the lower semiconductor die to the conductive via; and a first dielectric layer on the first metal layer; and the upper redistribution structure includes:

a second metal layer on the top side of the upper semiconductor die and the top side of the encapsulant, the second metal layer connecting the bond pad of the upper semiconductor die to the conductive via; and a second dielectric layer on the second metal layer.

5. The semiconductor device of claim 4, wherein the conductive via connects the first metal layer of the lower redistribution structure to the second metal layer of the upper redistribution structure.

6. The semiconductor device of claim 4, further comprising an external interconnection structure coupled to the first metal layer of the lower redistribution structure.

7. The semiconductor device of claim 1, wherein:

the upper semiconductor die includes sensing circuitry configured to sense phenomena through a sensing region of the top side of the upper semiconductor die;

the upper redistribution structure comprises one or more metal layers;

metal from the one or more metal layers does not extend over the sensing region of the top side of the upper semiconductor die; and the sensing circuitry is configured to sense, through the sensing region of the upper semiconductor die and the upper redistribution structure, phenomena of an environment external to the semiconductor device without obstruction from the metal of the one or more metal layers.

8. The semiconductor device of claim 1, wherein the encapsulant comprises an encapsulant upper portion that surrounds the upper semiconductor die and an encapsulant lower portion that surrounds the upper semiconductor die.

9. The semiconductor device of claim 8, wherein the encapsulant upper portion and the encapsulant lower portion are integrated and form a single integrated body of the encapsulant.

10. The semiconductor device of claim 8, wherein the encapsulant upper portion and the encapsulant lower portion are integrated and lack a discernable boundary between the encapsulant upper portion and the encapsulant lower portion.

11. The semiconductor device of claim 1, further comprising an external interconnection structure coupled to the lower redistribution structure.

12. The semiconductor device of claim 1, further comprising an insulating layer interposed between the conductive via and the encapsulant.

* * * * *